(12) United States Patent
Moon et al.

(10) Patent No.: US 10,509,498 B2
(45) Date of Patent: Dec. 17, 2019

(54) FOLDABLE DISPLAY DEVICE

(71) Applicant: LG Display Co., Ltd., Seoul (KR)

(72) Inventors: Young-Gyu Moon, Seoul (KR); Jong-Hyun Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 66 days.

(21) Appl. No.: 15/798,583

(22) Filed: Oct. 31, 2017

(65) Prior Publication Data

US 2018/0120997 A1 May 3, 2018

(30) Foreign Application Priority Data

Oct. 31, 2016 (KR) ........................ 10-2016-0143898

(51) Int. Cl.
| | |
|---|---|
| *G06F 3/041* | (2006.01) |
| *H01L 27/32* | (2006.01) |
| *H01L 51/00* | (2006.01) |
| *G06F 3/044* | (2006.01) |
| *H01L 27/12* | (2006.01) |
| *H01L 51/52* | (2006.01) |

(52) U.S. Cl.
CPC ............ *G06F 3/0412* (2013.01); *G06F 3/044* (2013.01); *H01L 27/323* (2013.01); *H01L 27/3262* (2013.01); *H01L 51/0097* (2013.01); *G06F 2203/04102* (2013.01); *G06F 2203/04111* (2013.01); *G06F 2203/04112* (2013.01); *H01L 27/124* (2013.01); *H01L 27/3276* (2013.01); *H01L 51/5203* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 9,130,181 B2 | 9/2015 | Choi et al. | |
| 9,287,342 B2 * | 3/2016 | Kwon | ................ H01L 27/3276 |
| 2012/0062447 A1 | 3/2012 | Tseng et al. | |

(Continued)

FOREIGN PATENT DOCUMENTS

| | | |
|---|---|---|
| CN | 102568377 A | 7/2012 |
| TW | I419094 A | 12/2013 |
| TW | 2014-07765 A | 2/2014 |

OTHER PUBLICATIONS

Office Action dated Jul. 26, 2018, issued in counterpart Taiwanese Patent Application No. 106137227.

*Primary Examiner* — David D Davis
(74) *Attorney, Agent, or Firm* — Morgan, Lewis & Bockius LLP

(57) ABSTRACT

A foldable display device may prevent defects in touch sensing, caused by stress concentrated at a folding part. A foldable display device may include a lower base material and an upper base material, each base material including at least one folding part and non-folding parts in a display area; a thin film transistor array on the lower base material; an organic light emitting array on the thin film transistor array; a touch electrode array disposed on the upper base material, and oppositely bonded to the organic light emitting array disposed opposite to the touch electrode array by an adhesive layer; and a plurality of wirings having a zigzag shape and uneven depth level in the folding part on the upper base material.

12 Claims, 15 Drawing Sheets

(56) References Cited

U.S. PATENT DOCUMENTS

| | | |
|---|---|---|
| 2012/0146886 A1 | 6/2012 | Minami et al. |
| 2015/0011030 A1 | 1/2015 | Choi et al. |
| 2015/0177878 A1* | 6/2015 | Cheng .................. G06F 3/044 |
| | | 345/174 |
| 2016/0014881 A1* | 1/2016 | Shin .................. G06F 1/1652 |
| | | 361/749 |
| 2016/0062520 A1* | 3/2016 | Choi .................. G09G 5/003 |
| | | 345/174 |
| 2016/0093644 A1* | 3/2016 | Ki .................. H01L 29/78672 |
| | | 257/40 |
| 2016/0172428 A1* | 6/2016 | Song .................. H01L 27/3276 |
| | | 257/99 |
| 2016/0174304 A1* | 6/2016 | Kim .................. H05B 33/04 |
| | | 313/511 |
| 2016/0181346 A1* | 6/2016 | Kwon .................. H01L 27/3276 |
| | | 257/40 |

\* cited by examiner

100

FOLDABLE DISPLAY DEVICE

This application claims the benefit of Korean Patent Application No. 10-2016-0143898, filed on Oct. 31, 2016, which is hereby incorporated by reference as if fully set forth herein.

BACKGROUND

Technical Field

The present disclosure relates to a foldable display device, and more particularly, to a foldable display device which may prevent defects in touch sensing caused by stress concentrated at a folding area.

Discussion of the Related Art

A display device, which displays various pieces of information on a screen, is a core technology in the information and communication age and is being developed to have small thickness, light weight, high portability, and high performance. Therefore, as a flat panel display device which may reduce weight and volume corresponding to drawbacks of a cathode ray tube (CRT), an organic light emitting display device which controls an amount of light emitted from an organic light emitting layer and displays an image is in the spotlight.

An organic light emitting display device includes a plurality of pixels arranged in a matrix. Here, each pixel includes a light emitting element, and a pixel driving circuit including a plurality of transistors to independently drive the light emitting element. Thus, the organic light emitting display device displays an image.

Such an organic light emitting display device uses self-luminous organic light emitting elements and thus does not require a separate light source, and is capable of being implemented as an ultra-slim foldable display. Therefore, research on a foldable organic light emitting display device having an in-cell touch structure which uses organic light emitting elements and includes a touchscreen within light emitting cells is under way.

Such a foldable organic light emitting display device having an in-cell touch structure is divided into a folding part, which is foldable, and non-folding parts, which are not foldable, and is manufactured by bonding an organic light emitting array including organic light emitting elements and a touchscreen disposed oppositely the organic light emitting array by an adhesive layer.

When the foldable organic light emitting display device is folded, stress is concentrated at a folding area. Due to stress concentrated at the folding area, there is high possibility that a wiring part located in the folding part or a touch electrode part of a touch sensor may be disconnected or cracked, and such a disconnection or crack may cause defects in touch sensing.

SUMMARY

Accordingly, the present disclosure is directed to a foldable display device that substantially obviates one or more problems due to limitations and disadvantages of the related art.

An object of the present disclosure is to provide a foldable display device which may prevent defects in touch sensing, caused by stress concentrated at a folding area.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a foldable display device includes a lower base material and an upper base material, each base material including at least one folding part and non-folding parts in a display area; a thin film transistor array on the lower base material; an organic light emitting array on the thin film transistor array; a touch electrode array disposed on the upper base material, and oppositely bonded to the organic light emitting array by an adhesive layer; and a plurality of wirings having a zigzag shape and uneven depth level in the folding part on the upper base material.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 15b is side sectional view taken along line B-B' of FIG. 15a.

DETAILED DESCRIPTION

Figure 1:
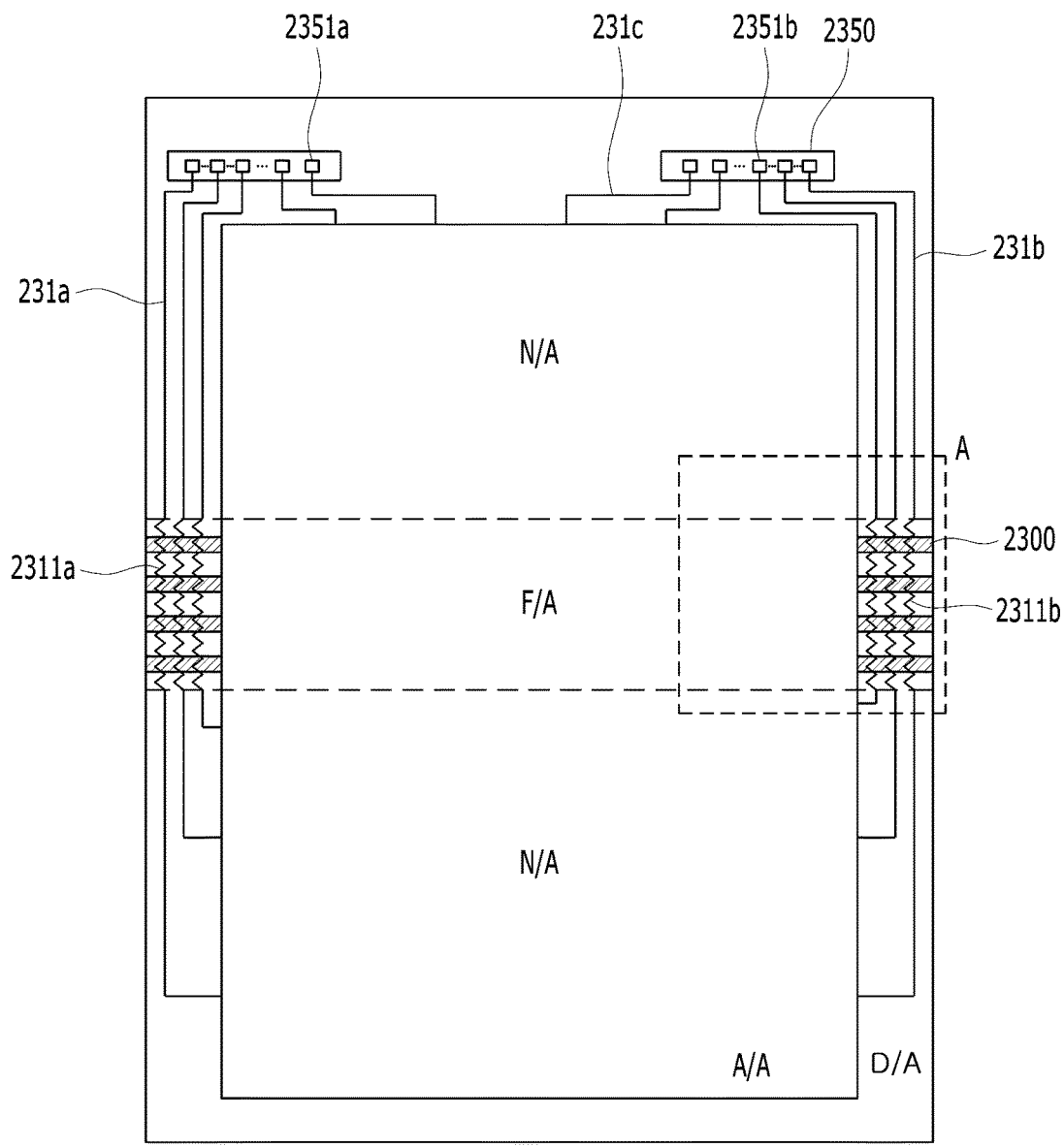
FIG. 1 is a schematic view illustrating a foldable display device in accordance with an example embodiment of the present disclosure.

Reference will now be made in detail to the preferred embodiments of the present disclosure, examples of which are illustrated in the accompanying drawings. Wherever possible, the same reference numbers will be used throughout the drawings to refer to the same or like parts. In the following description of the present disclosure, a detailed description of known functions and configurations incorporated herein will be omitted when it may make the subject matter of the present disclosure rather unclear. Additionally, the terms of elements used in the following description are selected only in consideration of ease in preparation of the specification and may thus substantially differ from the terms of parts of an actual product.

In the following description of the embodiments, when will be understood that, if an element or layer is referred to as being "on" or "under" another element or layer, it can be directly "on" or "under" the other element or layer, or may be indirectly formed with one or more intervening elements or layers therebetween. On the other hand, it will be understood that, when an element or layer is referred to as "contacting" another element or layer, no element or layer is present therebetween.

The sizes and thicknesses of respective elements illustrated in the drawings are only for the purpose of convenience of description, and the elements are not limited to the illustrated sizes and thicknesses.

Figure 2:
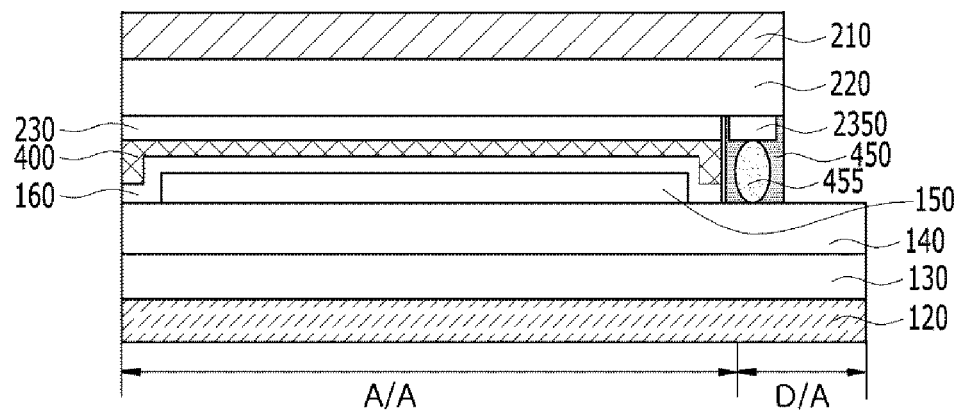
FIG. 2 is a cross-sectional view of an array structure of the foldable display device in accordance with an example embodiment of the present disclosure.

FIG. 1 is a schematic view illustrating a foldable display device in accordance with an example embodiment of the present disclosure, and FIG. 2 is a cross-sectional view of an array structure of the foldable display device in accordance with an example embodiment of the present disclosure.

With reference to FIGS. 1 and 2, a foldable display device in accordance with the example embodiment of the present disclosure includes a display panel 100 including at least one folding part F/A and non-folding parts N/A within a display area.

With reference to FIG. 2, the display panel 100 will be described in more detail. The display panel 100 in accordance with this example embodiment includes a first base material 120 having flexibility, a first buffer layer 130 located on the first base material 120, a thin film transistor array 140 including pixels defined in a matrix on the first buffer layer 130 and thin film transistors respectively disposed in the pixels, an organic light emitting array 150 connected to the thin film transistors of the respective pixels, a protective layer 160 covering the thin film transistor array 140 and the organic light emitting array 150 except for pad parts, a touch electrode array 230 attached to the protective layer 160 by an adhesive layer 400 interposed therebetween, a second buffer layer 220 formed on the touch electrode array 230, and a second base material 210 having flexibility formed on the second buffer layer 220, but the disclosure is not limited thereto.

The first base material 120, the first buffer layer 130, the thin film transistor array 140, and the organic light emitting array 150 may be formed on a lower substrate (not shown) which is separately prepared, and the second base material 210, the second buffer layer 220, and the touch electrode array 230 may be formed on an upper substrate (not shown) which is separately prepared. In this case, after the upper substrate and the lower substrate are disposed oppositely each other and bonded by the adhesive layer 400, the upper substrate and the lower substrate are removed through a method, such as laser irradiation, thus producing a flexible display device.

An active area A/A and a dead area D/A are defined on each of the first buffer layer 130 and the second buffer layer 220, and the touch electrode array 230, the organic light emitting array 150, and the thin film transistors in the thin film transistor array 140 except for the pad parts are formed in the active area A/A. Touch pad parts 2350 and the pad parts of the thin film transistor array 140 are defined in parts of the dead area D/A.

Here, the first and second base materials 120 and 210 serve to prevent damage to internal arrays during laser irradiation or an etching process, and as circumstances require, the first and second base materials 120 and 210 also serve to protect the display device from the outside. The first and second base materials 120 and 210 may be formed of a polymer, such as polyimide or photoacryl.

Each of the first buffer layer 130 and the second buffer layer 220 is formed by continuously stacking the same inorganic film, such as an oxide ($SiO_2$) film or a nitride ($SiN_x$) film, or alternately stacking different inorganic films. The first and second buffer layers 130 and 220 serve as barriers to prevent moisture or outdoor air from permeating the organic light emitting array 150 after a process of bonding the upper and lower substrates.

The touch electrode array 230 and the touch pad parts 2350 are formed on the same surface of the second buffer layer 220. The touch pad parts 2350 are connected to the pad parts (not shown) of the thin film transistor array 140 by a sealer 450 including conductive balls 455 during the process of bonding the upper and lower substrates by the adhesive layer 400. Here, the adhesive layer 400 has a moisture-permeation preventing function, and directly contacts the protective layer 160 covering the organic light emitting array 150 and thus serves to prevent outdoor air from permeating the organic light emitting array 150 and to more completely prevent moisture from permeating the organic light emitting array 150, in addition to the function of the protective layer 160.

The touch pad parts 2350 includes a plurality of touch pad parts 2351a and 2351b. Although not shown in FIGS. 1 and 2, a plurality of touch pad electrodes is provided in the active area A/A. The touch pad parts 2351a and 2351b are connected to the touch electrodes provided in the active area A/A through routing lines 231a and 231b, and the touch pad parts 2351a and 2351b respectively supply touch signals to the touch electrodes. The connection structure of the routing lines 231a and 231b and the touch electrodes will be described later.

Here, one side of the thin film transistor array 140 including the pad parts protrudes from the touch electrode array 230, and a driving circuit which transmits a signal to together drive the touch electrode array 230, the thin film transistor array 140, and the organic light emitting array 150 may be provided at the protruding part of the thin film transistor array 140, but the disclosure is not limited thereto. Although not shown in the drawings, the driving circuit, thin film transistor array driving pads, and dummy pads include a plurality of dummy electrodes. The plurality of dummy electrodes is connected to the driving circuit by wirings.

Further, the driving circuit is bonded and connected to a flexible printed circuit board (FPCB, not shown) and may thus be controlled by a timing controller (not shown) and a microcontroller unit (MCU, not shown) provided on the FPCB. The dummy pads are formed in the same layer as a metal layer forming gate lines or data lines in regions corresponding to the touch pad parts 2350. The dummy pads are located at the dead area D/A at the outside of the active area A/A. Further, the driving circuit may be mounted on the FPCB or on an anisotropic conductive film (ACF) and thus provided on the rear surface of the display panel 100.

The driving circuit mounted on the FPCB or the ACF may be mounted in a chip on film (COF) manner.

Although not shown in the drawings, the thin film transistor array driving pads and the dummy pads are connected to the FPCB by wirings (not shown). Further, a controller (not shown) to control the driving circuit may be provided on the FPCB.

A plurality of grooves 2300 is provided in the dead area D/A located at both sides of the folding part F/A. Here, the grooves 2300 may be formed to have a linear shape, the major axis of which is provided in the horizontal direction.

The above-described routing lines 231a and 231b are provided at both sides of the active area A/A and connected to the respective touch electrodes. That is, the routing lines 231a and 231b are formed to have zigzag shape 2311a and 2311b in the folding part F/A, and pass through the grooves 2300 located in the folding part F/A. Therefore, the routing lines 231a and 231b passing through the grooves 2300 are uneven due to the grooves 2300. This will be described in more detail through FIG. 3, which is an enlarged view of portion A of FIG. 1.

Figure 3:
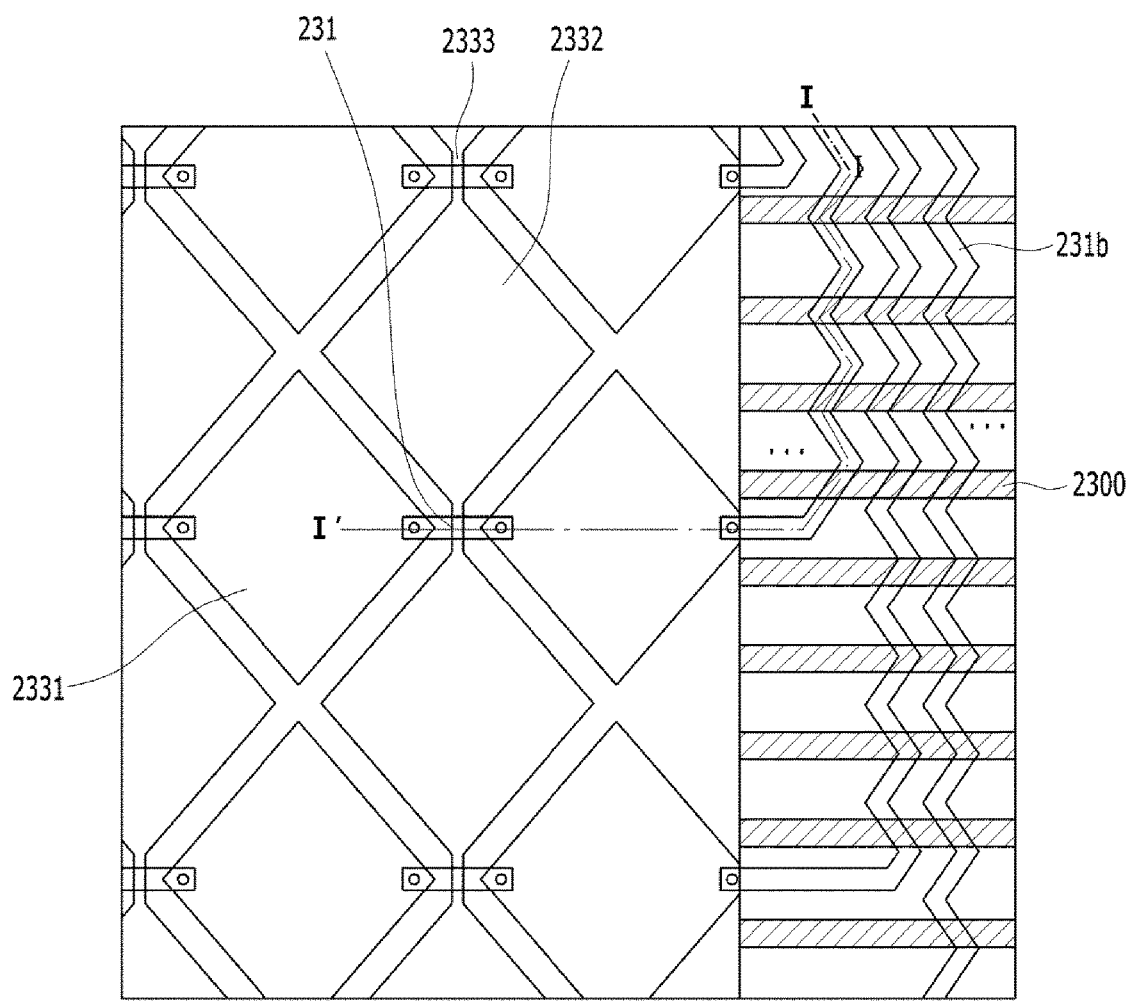
FIG. 3 is an enlarged view of portion A of FIG. 1.

As shown by example in FIG. 3, the touch electrode array 230 in accordance with the present disclosure includes island-shaped first electrode patterns 2331 physically spaced apart from one another in a first direction, and metal bridges 231 conductively connecting the first electrode patterns 2331 to adjacent first electrode patterns 2331 in another layer. The touch electrode array 230 further includes second electrode patterns 2332 disposed in a direction intersecting the first direction and having the same shape as the first electrode patterns 2331, and connection patterns 2333 connecting the second electrode patterns 2332 with neighboring second electrode patterns 2332.

The routing lines 231b connecting the touch electrodes provided on the touch electrode array 230 to the touch pad part 2350 are provided at the outside of the active area A/A.

As shown by example in FIG. 3, the routing lines 231b extend in the vertical axis direction and contact the first electrode patterns 2331 located at the edge of the active area A/A. Here, the routing lines 231b provided in the folding part F/A have a zigzag shape. The zigzag shape is a shape formed by angled corners.

Further, as described above, the grooves 2300 are provided in the dead area D/A at the outside of the active area A/A within the folding part F/A. The grooves 2300 have a linear shape, the major axis of which extends in the horizontal direction, e.g., in the horizontal axis direction, and traverses the dead area D/A. The grooves 2300 are located below the routing lines 231b so that the routing lines 231b pass over the grooves 2300, and thus the routing lines 231b have first irregular parts 2301, which are uneven, in the grooves 2300.

Figure 4:
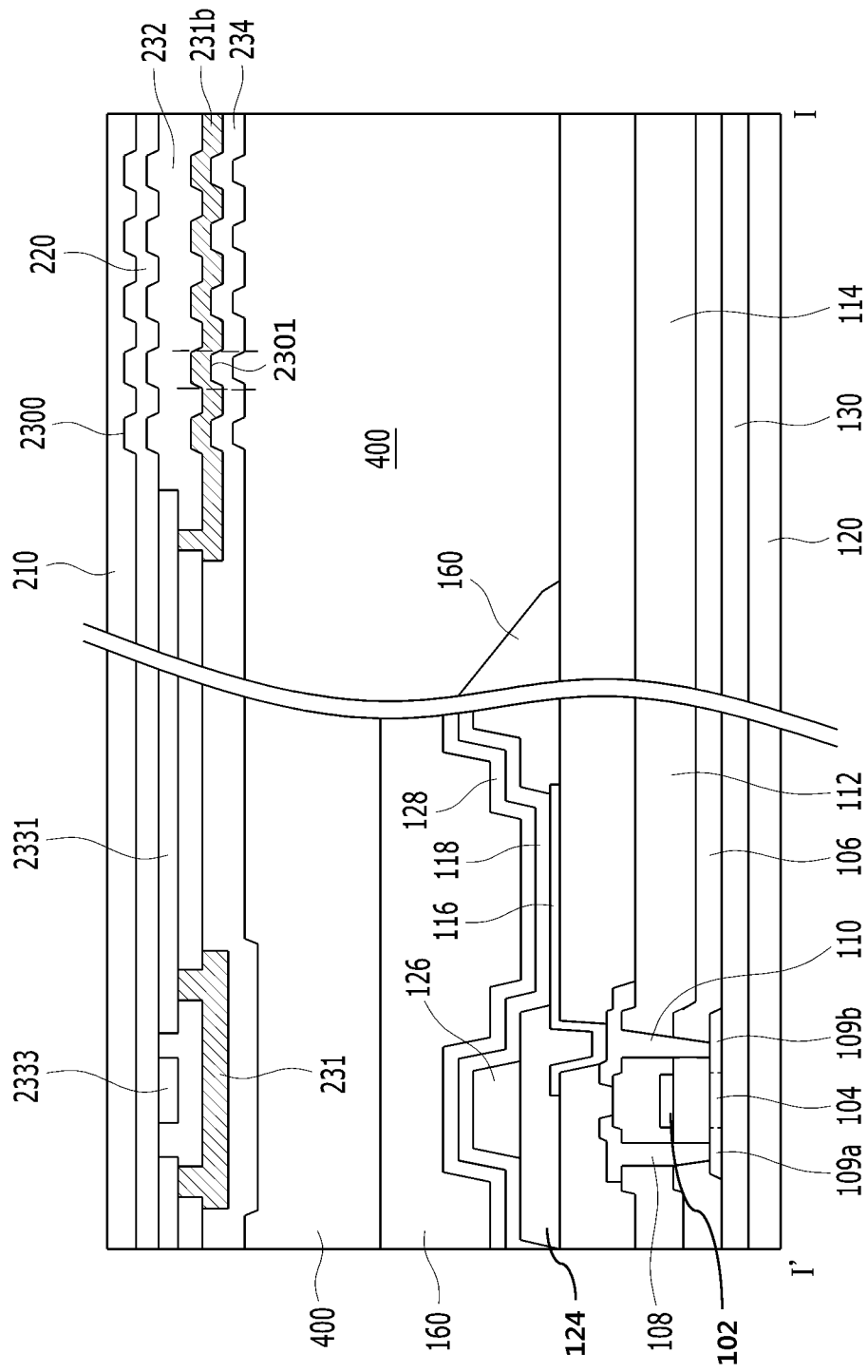
FIG. 4 is a cross-sectional view taken along line I-I' of FIG. 3.

FIG. 4 is a cross-sectional view taken along line I-I' of FIG. 3. With reference to FIG. 4, the buffer layer 130 is located on the first base material 120. The thin film transistor array 140 includes a plurality of thin film transistors. In more detail, the thin film transistor array 140 includes an active layer 104 including source and drain 109a and 109b, a gate insulating film 106 located on the active layer 104, a gate electrode 102 located on the gate insulating film 106, a lower interlayer insulating film 112 located so as to cover gate electrode 102, contact holes formed by patterning the lower interlayer insulating film 112 and the gate insulating film 106 so as to expose the source and drain 109a and 109b, and source and drain electrodes 108 and 110 respectively connected to the source and drain 109a and 109b. The source electrode 108 and the drain electrode 110 are covered with a lower passivation layer 114.

The organic light emitting array 150 is located on the thin film transistor array 140. In more detail, the organic light emitting array 150 includes a first electrode 116 connected to the drain electrode 110 through a contact hole formed by patterning the lower passivation layer 114 so as to expose the drain electrode 110, a bank insulating film 124 located on the lower passivation layer 114 and the first electrode 116 and defining respective pixel openings, a spacer 126 located on the bank insulating film 124, an organic layer 118 including a light emitting layer located on the first electrode 116, and a second electrode 128 located on the organic layer 118. Further, as described above, the organic light emitting array 150 is sealed by the protective layer 160.

The second buffer layer 220 is formed on the second base material 210 in the active area A/A. The first and second touch electrodes 2331 and 2332 are formed on the second buffer layer 220. A first upper passivation layer 232 provided with contact holes to expose a part of each of the first touch electrodes 2331 is formed thereon. The bridges 231 connecting neighboring first touch electrodes 2331 through the contact holes are formed. A second upper passivation layer 234 is formed on the bridges 231. However, the disclosure is not limited thereto. Because the touch electrode array 230 formed by the above procedure is bonded to the protective layer 160 disposed oppositely the touch electrode array 230 through the adhesive layer 400, the touch electrode array 230 is bonded upside down to the protective layer 160.

The grooves 2300 are formed on the second base material 210 in the dead area D/A at the outside of the active area A/A. The second buffer layer 220 and the first upper passivation layer 232 are formed on the grooves 2300, and the routing lines 231b are provided on the first upper passivation layer 232. Here, the second buffer layer 220 and the first upper passivation layer 232 have uneven parts due to the grooves 2300, and the routing lines 231b formed on the first upper passivation layer 232 are uneven in the grooves 2300 and thus have the first irregular parts 2301.

The routing lines 231b are connected to the first touch electrodes 2331 located at the edge of the active area A/A through contact holes. Here, the routing lines 231b may be formed of the same material as the bridges 231 and in the same layer as the bridges 231. The dead area D/A is also bonded upside down to the organic light emitting array 150 disposed opposite the dead area D/A through the adhesive layer 400.

Figure 5:
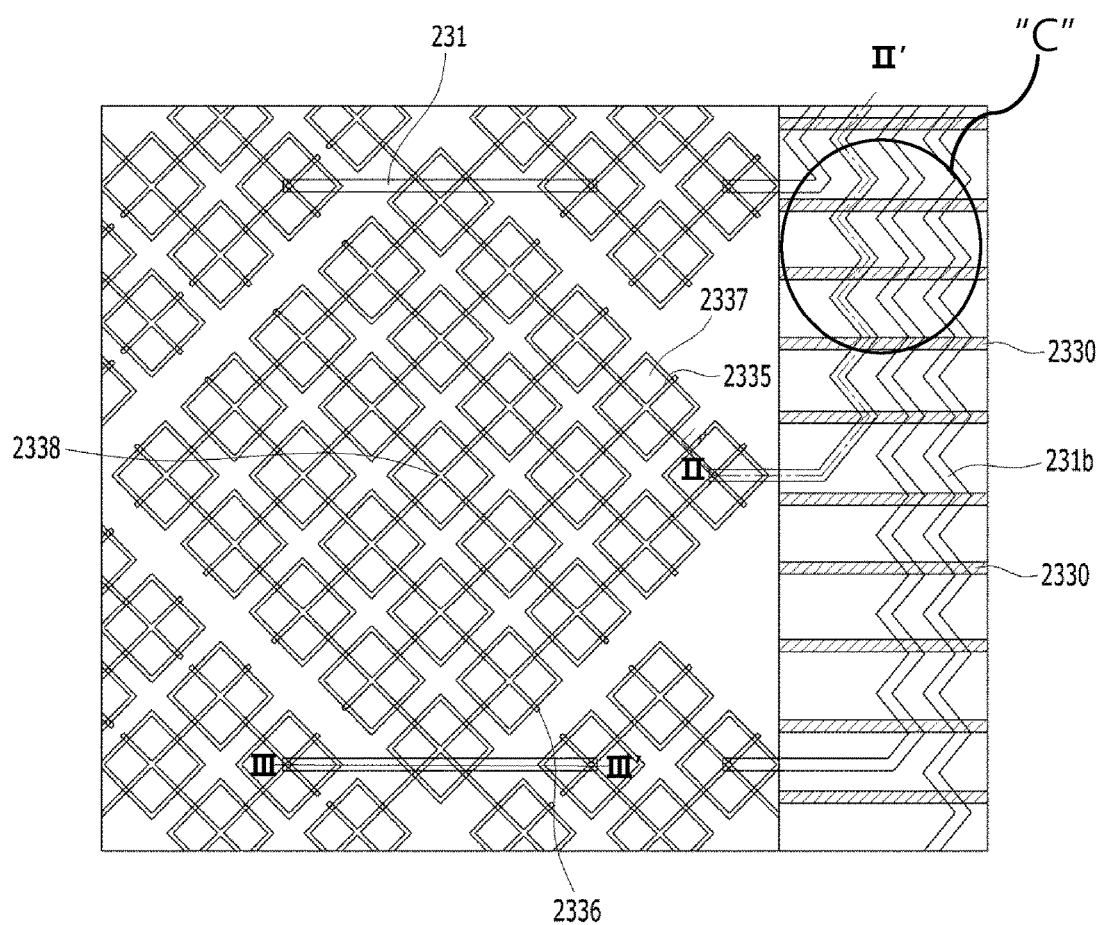
FIG. 5 is a view illustrating an organic light emitting display device having an in-cell touch structure in which a touch electrode includes a metal mesh structure.

FIG. 5 is a view illustrating an organic light emitting display device having an in-cell touch structure in which a touch electrode includes a metal mesh structure.

The touch electrode array 230 may include metal mesh electrodes including lattice structures. The touch electrode array 230 includes a plurality of first mesh electrodes 2335 arranged in a first direction and a plurality of second mesh electrodes 2336 arranged in a second direction intersecting the first direction, on a substrate 1000. This embodiment illustrates an example of the horizontal direction as the first direction and the vertical direction as the second direction, but the disclosure is not limited thereto.

Each of the first mesh electrodes 2335 and the second mesh electrodes 2336 respectively includes a plurality of lattice structures.

The first mesh electrodes 2335 arranged adjacent to one another in the first direction are connected by the bridges 231. Further, the second mesh electrodes 2336 arranged adjacent to one another in the second direction are connected by connection mesh patterns 2338. Segment electrodes 2337 may be further provided on the lattice structures of the first and second mesh electrodes 2335 and 2336. The segment electrodes 2337 may be formed of a transparent conductive material, such as ITO, IZO, IGZO, or ZnO, but the disclosure is not limited thereto.

Figure 6:
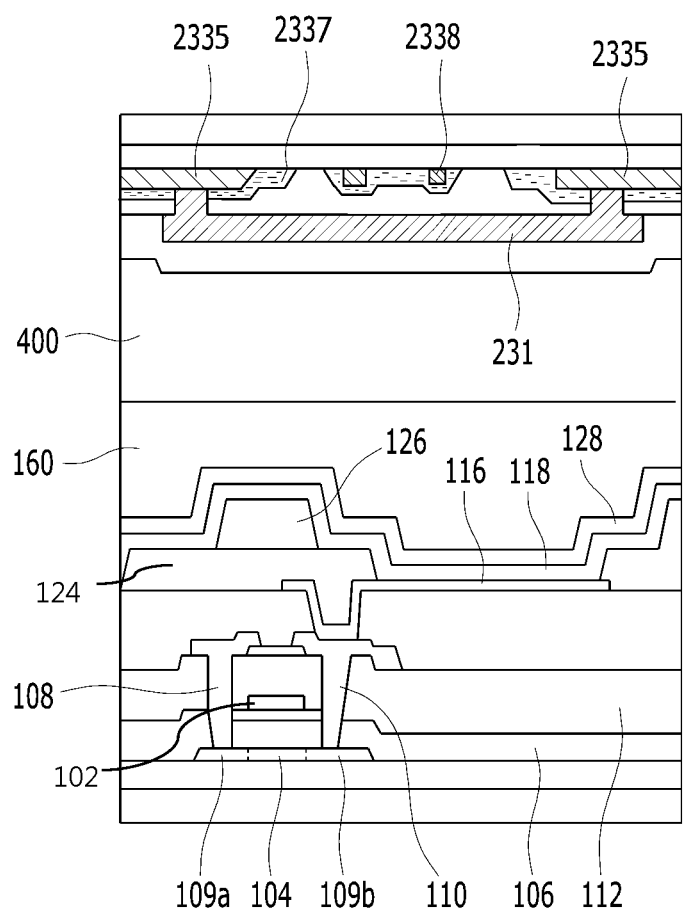
FIG. 6 is a cross-sectional view taken along line III-III' of FIG. 5.
Figure 7:
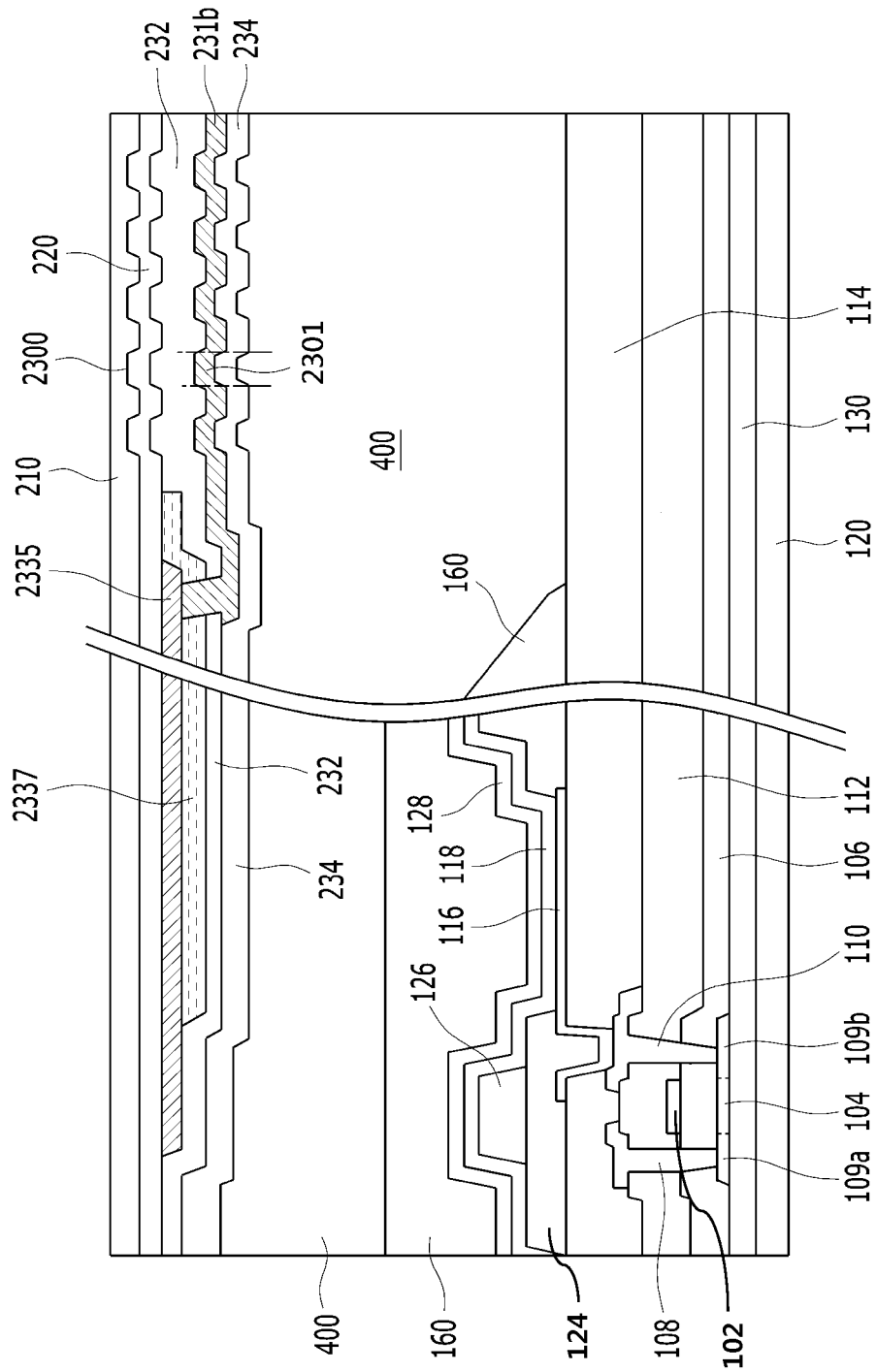
FIG. 7 is a cross-sectional view taken along line II-II' of FIG. 5.

FIG. 6 is a cross-sectional view taken along line III-III' of FIG. 5, and FIG. 7 is a cross-sectional view taken along line II-II of FIG. 5.

The second buffer layer 220 is formed on the second base material 210 in the active area A/A. The first and second mesh electrodes 2335 and 2336 are formed on the second buffer layer 220. The segment electrodes 2337 are formed on the first and second mesh electrodes 2335 and 2336. The first upper passivation layer 232 provided with contact holes, each of which exposes a part of each of the first mesh electrodes 2335, is formed on the segment electrodes 2337 and the first and second mesh electrodes 2335 and 2336. The bridges 231 connecting neighboring first mesh electrodes 2335 through the contact holes are formed. The second upper passivation layer 234 is formed on the bridges 231. However, the disclosure is not limited thereto. Because the touch electrode array 230 is bonded to the protective layer 160 disposed oppositely the touch electrode array 230 by the adhesive layer 400, the above-described touch electrode array 230 is bonded upside down to the protective layer 160.

Although this embodiment illustrates, as an example, the grooves 2300 as being formed on the second base material 210, the disclosure is not limited thereto, and the grooves 2300 may be formed by patterning at least one of the second base material 210 and the second buffer layer 220.

The grooves 2300 may be connected to the first touch electrodes 2331 located at the edge of the active area A/A through contact holes. Configurations of the remaining grooves 2300 and the routing lines 231b may be the same as those of the routing lines 231b shown in FIG. 4, and a detailed description thereof will thus be omitted.

The organic light emitting display device having an in-cell touch structure in accordance with example embodiments of the present disclosure includes the routing lines 231a and 231b formed to have a zigzag shape so that the routing lines 231a and 231b passing through the folding part F/A mismatch with a folding angle of the folding part F/A. Due to such a mismatch between the routing lines 231a and 231b and the folding angle of the folding part F/A, stress applied to the routing lines 231a and 231b can be reduced, and foldability of the routing lines 231a and 231b can be increased. Thus, defects such as disconnections of the routing lines 231a and 231b due to folding can be prevented.

In addition, the organic light emitting display device having an in-cell touch structure in accordance with example embodiments of the present disclosure includes the grooves 2300 provided under the routing lines 231a and 231b to overlap the routing lines 231a and 231b, and thus, the routing lines 231a and 231b not only have a zigzag shape but also include the first irregular parts 2301 which are uneven in the deep direction. Therefore, the routing lines 231a and 231b mismatch with the folding angle of the folding part F/A in the deep direction. Thus, stress applied to the routing lines 231a and 231b can be greatly reduced and foldability of the routing lines 231a and 231b can be further improved.

Further, the grooves 2300 may serve to reduce stress applied to the second base material 210 and the second buffer layer 220 when the in-cell touch organic light emitting display device is folded, and to prevent crack propagation if a crack occurs. Thus, reliability of the in-cell touch organic light emitting display device may be increased.

As described above, the grooves 2300 may be formed by patterning at least one of the second base material 210 and the second buffer layer 220. However, because the thickness of the second base material 210 is greater than the thickness of the second buffer layer 220, in order to increase a thickness difference caused by the grooves 2300, formation of the grooves 2300 may include patterning of the second base material 210.

Figure 8:
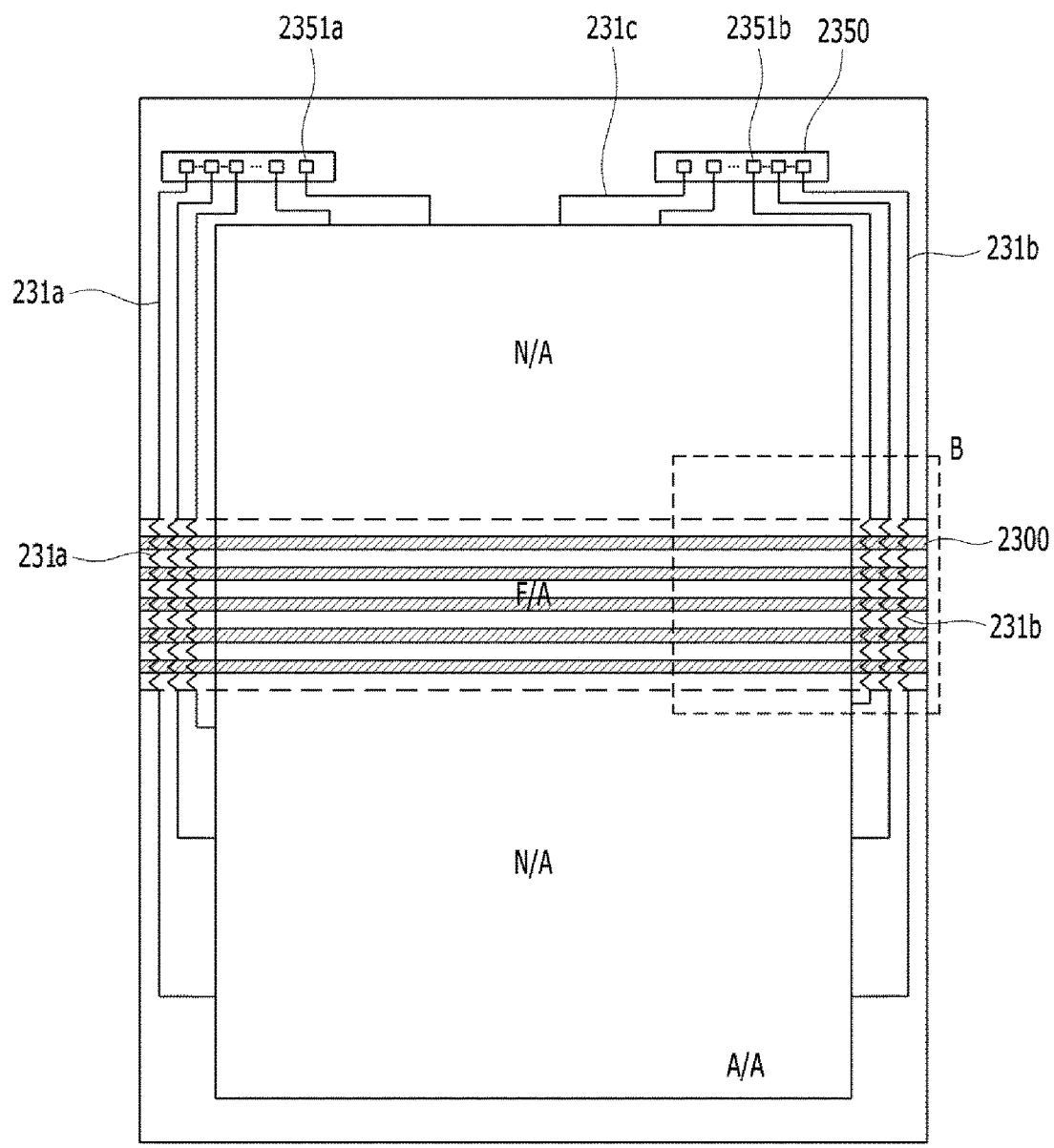
FIG. 8 is a schematic view illustrating a foldable display device in accordance with another example embodiment of the present disclosure.

FIG. 8 is a schematic view illustrating a foldable display device in accordance with another example embodiment of the present disclosure.

The foldable display device in accordance with this example embodiment may be the same as the foldable display device in accordance with the example embodiment(s) described above except that grooves 2300 are disposed to have a linear shape traversing an active area A/A in the horizontal direction. Here, the grooves 2300 are formed to be extended from one side edge of a folding part F/A to the other side edge of the folding part F/A via the active area A/A. Therefore, uneven parts are formed in the active area A/A as well as in regions in which routing lines 231b pass through the folding part F/A.

Figure 9:
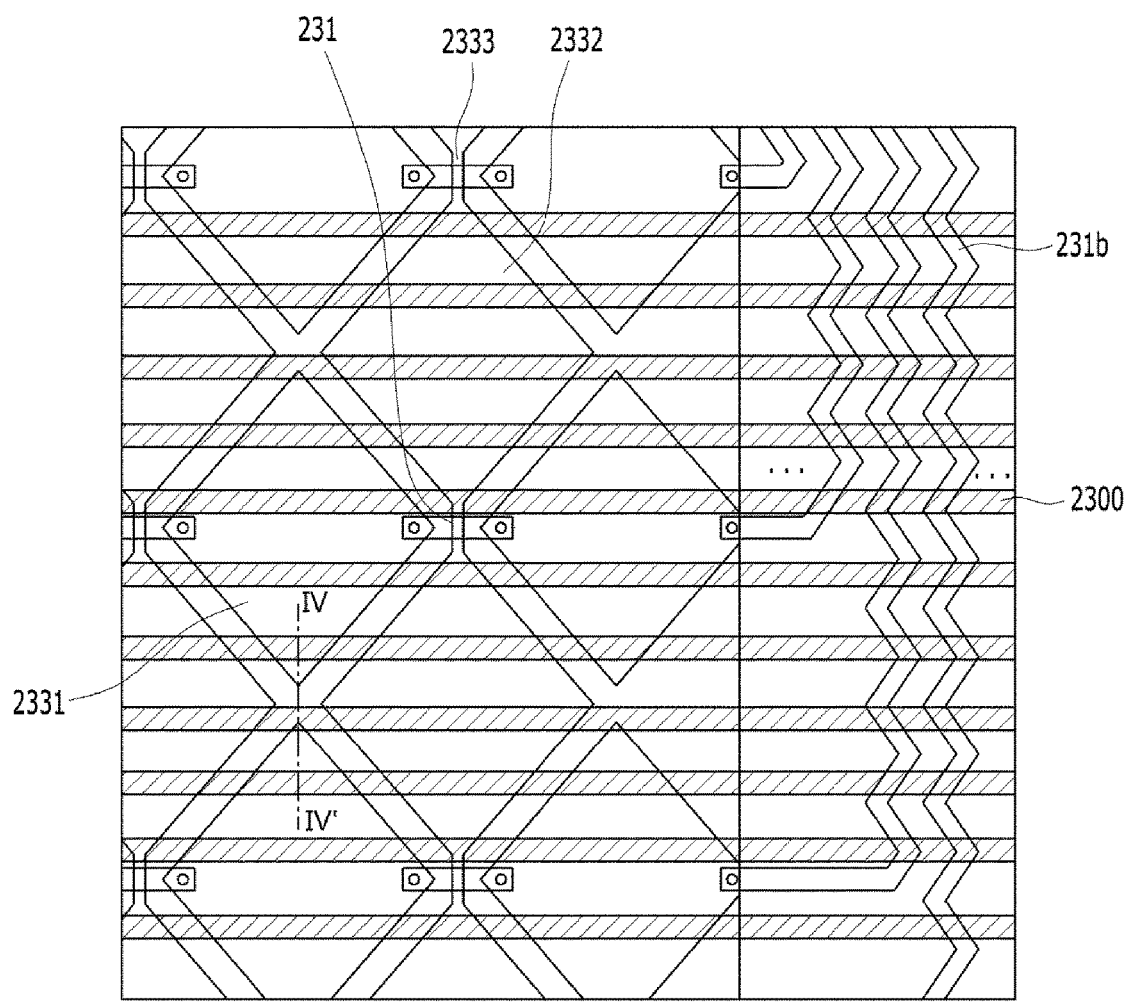
FIG. 9 is an enlarged view of portion B of FIG. 8.

FIG. 9 is a schematic view of portion B of FIG. 8. As shown by example in FIG. 9, the grooves 2300 extend to the active area A/A of the folding part F/A as well as to the dead area D/A of the folding part F/A. Therefore, the grooves 2300 may be provided under first electrode patterns 2331, second electrode patterns 2332, bridges 231, and connection patterns 2333.

Figure 10:
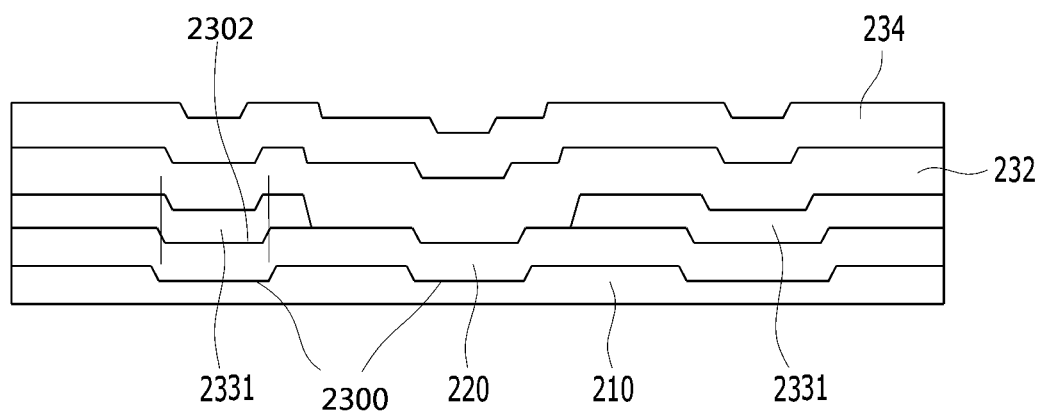
FIG. 10 is a cross-sectional view taken along line IV-IV' of FIG. 9.

For example, the portion B will be described in more detail with reference to FIG. 10, which is a cross-sectional view taken along line IV-IV' of FIG. 9. With reference to FIG. 10, the first electrode patterns 2331 are formed on the grooves 2300 and thus the uneven parts include second irregular parts 2302. First and second passivation layers 232 and 234 are formed on the first electrode patterns 2331.

Configurations of a thin film transistor array 140, an organic light emitting array 150 and a protective layer 160 formed on a first base material 120 may be the same as described for the example embodiment(s) above, and illustration thereof will thus be omitted in FIG. 10.

A touch electrode array 230 shown in FIG. 10 is also bonded upside down to an adhesive layer 400.

Figure 11:
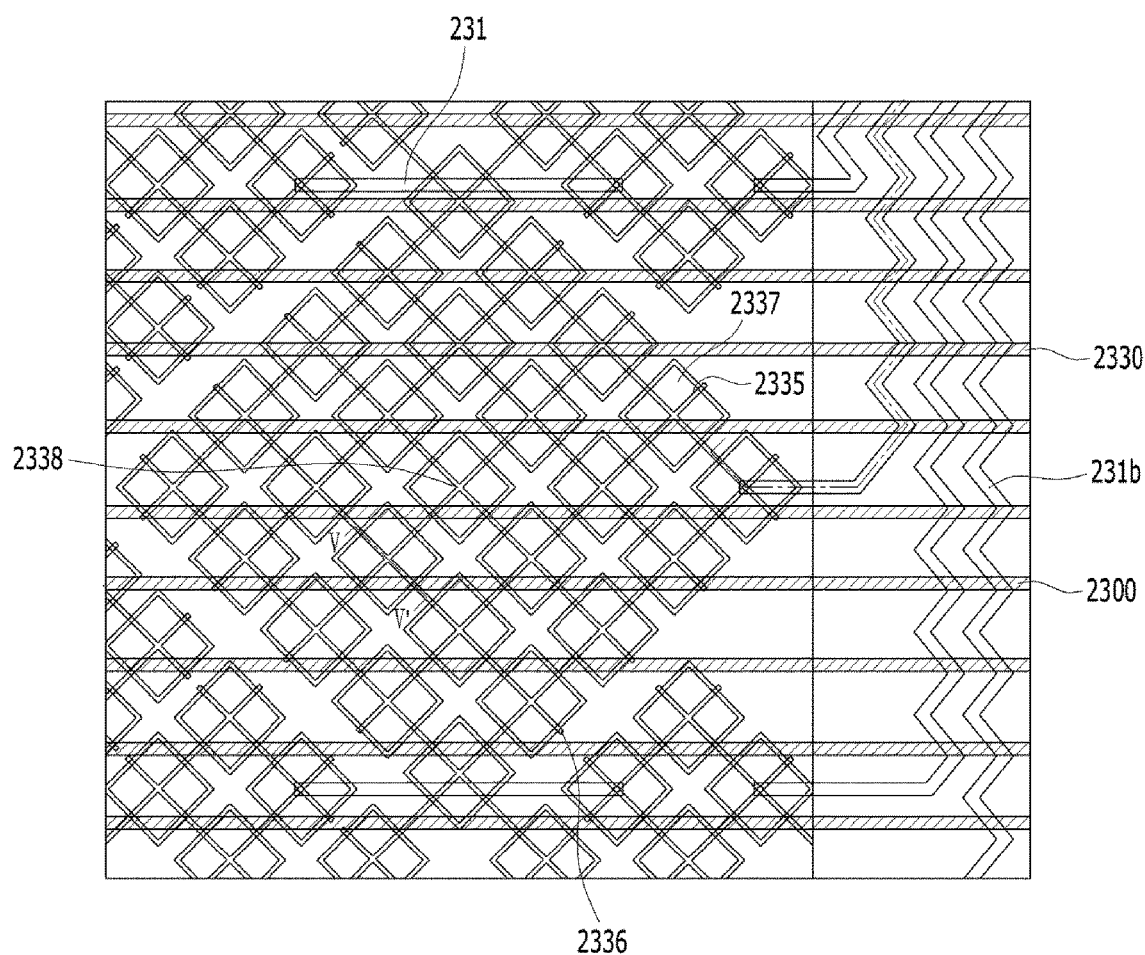
FIG. 11 is a schematic view illustrating the foldable display device in accordance with an example embodiment of the present disclosure shown in FIG. 8, in which a touch electrode includes a metal mesh structure.

As shown by example in FIG. 11, touch electrodes in this example embodiment may have lattice structures, in the same manner as example embodiment(s) described above. In the same manner as in FIG. 9, the grooves 2300 are formed under first and second mesh electrodes 2335 and 2336.

Figure 12:
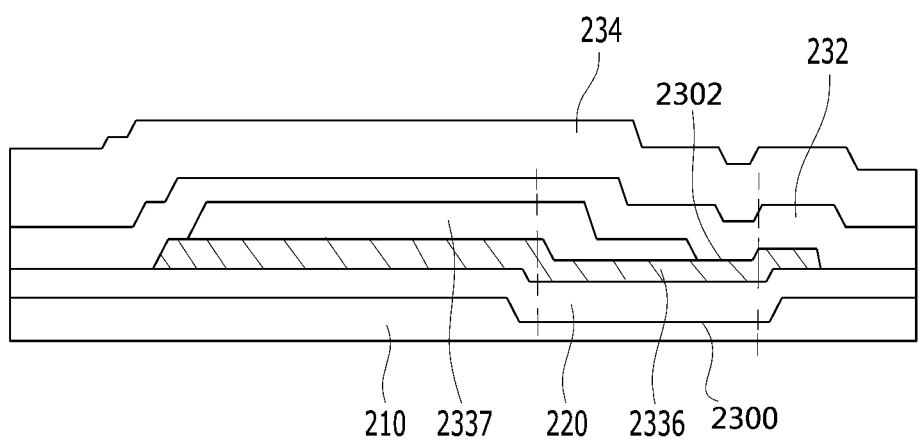
FIG. 12 is a cross-sectional view taken along line V-V' of FIG. 11.

With reference to FIG. 12, which is a cross-sectional view taken along line V-V' of FIG. 11, a partial region of the second mesh electrode 2336 overlaps the groove 2300 formed by patterning a second base material 210. Therefore, the second mesh electrode 2336 includes a second irregular part 2302 which is uneven. Although not shown in the drawings, a partial region of the first mesh electrode 2335 overlaps the groove 2300, and thus, the first mesh electrode 2335 also includes a second irregular part.

In the same manner as in the example embodiment(s) described above, a touch electrode array 230 having the cross-section of FIG. 12 is bonded upside down to the organic light emitting array 150 disposed oppositely the touch electrode array 230 through the adhesive layer 400.

In this example embodiment, the grooves 2300 are provided under the touch electrodes in the active area A/A. Therefore, in accordance with this example embodiment of the present disclosure, the touch electrodes in the active area A/A form irregular parts which are uneven in the deep direction, and thus, foldability of the touch electrodes is increased. Accordingly, the foldable display device in accordance with this example embodiment reduces defects in touch sensing and improves reliability. In this example embodiment, the grooves 2300 may be formed by patterning at least one of the second base material 210 and a second buffer layer 220.

Figure 13:
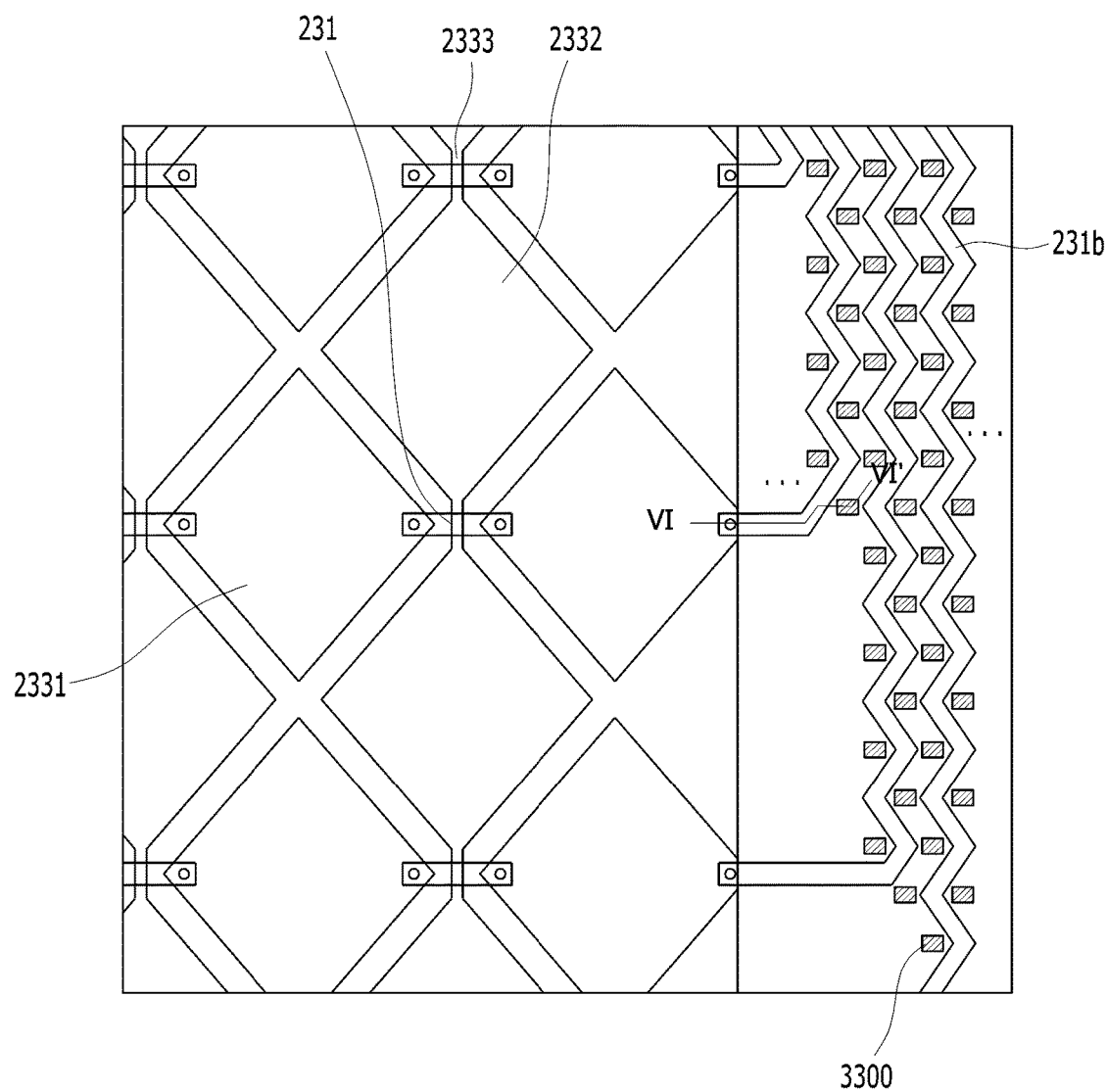
FIG. 13 is a schematic view illustrating an organic light emitting display device having an in-cell touch structure in accordance with another example embodiment of the present disclosure.

FIG. 13 is a schematic view illustrating an organic light emitting display device having an in-cell touch structure in accordance with yet another example embodiment of the present disclosure. An active area A/A of the in-cell touch organic light emitting display device in accordance with this example embodiment of the present disclosure may be the same as the active area A/A of the in-cell touch organic light emitting display device in accordance with the example embodiments shown and described above, such as that of FIG. 1, and a detailed description thereof will thus be limited. In this example embodiment, grooves 3300 are provided inside regions of routing lines 231*b* bent in zigzags.

Although FIG. 13 illustrates first and second electrode patterns 2331 and 2332, touch electrodes may include mesh electrodes in the same manner as in the example embodiment(s) described above.

Figure 14:
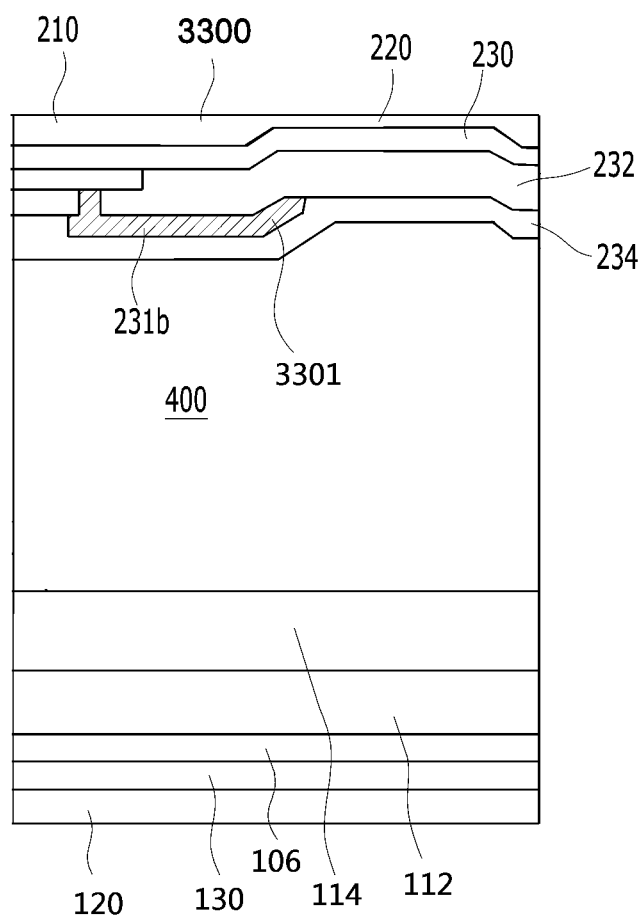
FIG. 14 is a cross-sectional view taken along line VI-VI' of FIG. 13.

FIG. 14 is a cross-sectional view taken along line VI-VI' of FIG. 13.

With reference to FIG. 14, the grooves 3300 are provided inside the regions of routing lines 231*b* bent in zigzags, and a part of the routing line 231*b* overlaps an inclined side of the groove 3300. Thereby, the routing lines 231*b* have third irregular parts 3301 which are uneven in the deep direction, and the in-cell touch organic light emitting display device in accordance with this example embodiment may have the same or similar effects of the in-cell touch organic light emitting display device as in accordance with the example embodiment(s) described above, such as that shown in FIG. 1.

Figure 15A:
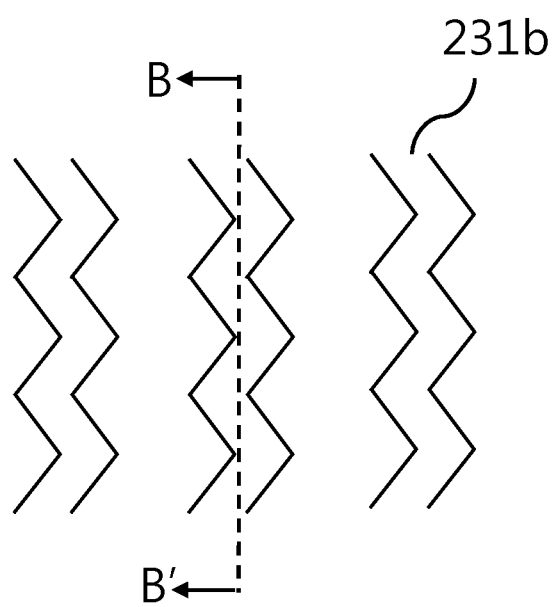
FIG. 15a is a plan view illustrating routing lines of a "C" area of FIG. 5.
Figure 15B:
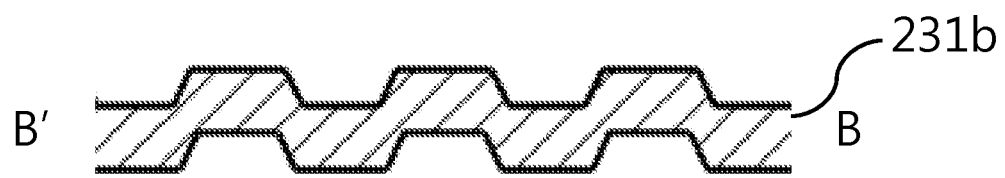

FIG. 15*a* is a plan view illustrating routing lines of a "C" area of FIG. 5, and FIG. 15*b* is side sectional view taken along line B-B' of FIG. 15*a*.

As shown in FIG. 15*a*, the routing lines 231*b* are formed to have a zigzag shape. The routing lines are formed to have uneven depth level as shown in FIG. 15*b*. In other words, the routing lines 231*b* look like mogul ski lines which have zigzag lines and repeated up and down lines, as shown in FIGS. 15*a* and 15*b*. Therefore, the organic light emitting display device having an in-cell touch structure in accordance with the example embodiment(s) of the present disclosure may have satisfactory durability against tearing.

Figure 16:
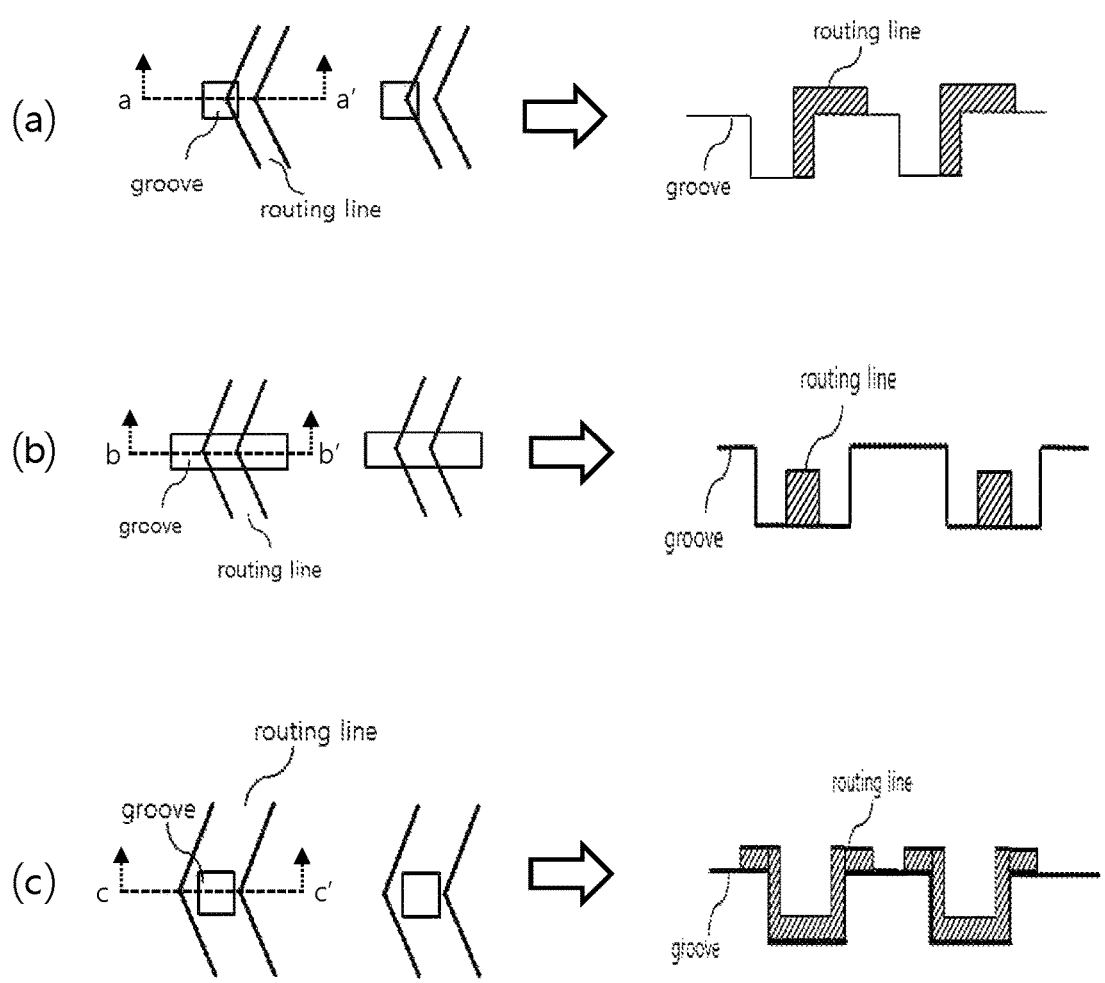
FIG. 16 shows various arrangements between routing lines and grooves according to the embodiments of the present invention.

FIG. 16 shows various arrangements between routing lines and grooves according to the embodiments of the present invention. (a) shows a plan view illustrating the routing line overlaps an inclined side of the groove and a side sectional view taken along line a-a' of the plan view. (b) shows a plan view of the routing line located in the groove and a side sectional view taken along line b-b' of the plan view. (c) shows a plan view illustrating the routing line completely overlaps the groove and a side sectional view taken along line c-c' of the plan view.

As is apparent from the above description, an organic light emitting display device having an in-cell touch structure in accordance with example embodiments of the present disclosure includes routing lines having a zigzag shape so that wirings passing through a folding part are arranged to mismatch with a folding angle of the folding part. Due to such a mismatch between the wirings and the folding angle of the folding part, stress applied to the wirings may be reduced and foldability of the wirings may be increased, thus preventing defects, such as disconnections of the wirings due to folding.

In addition, the organic light emitting display device having an in-cell touch structure in accordance with example embodiments of the present disclosure includes grooves provided under the wirings so as to overlap the wirings, and thus, the wirings not only have a zigzag shape but also include irregular parts which are uneven in the deep direction. Therefore, the wirings mismatch with the folding angle of the folding part even in the deep direction, and thus, stress applied to the wirings may be greatly reduced and foldability may be improved.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A foldable display device comprising:
   a lower base material and an upper base material, each base material including at least one folding part and non-folding parts in a display area;
   a thin film transistor array on the lower base material;
   an organic light emitting array on the thin film transistor array;
   a touch electrode array disposed on the upper base material, and oppositely bonded to the organic light emitting array by an adhesive layer; and
   a plurality of wirings having a zigzag shape and uneven depth level in the folding part on the upper base material,
   wherein the touch electrode array includes a plurality of grooves overlapping the plurality of wirings in the folding part, and
   wherein the wirings pass under the grooves and include first irregular parts that are uneven in a region corresponding to the grooves.

2. The foldable display device according to claim 1, wherein:
   the touch electrode array includes a plurality of touch electrodes; and
   the grooves are in a non-display area outside the display area, and the wirings are a plurality of routing lines provided to the touch electrode array to supply a plurality of signals.

3. The foldable display device according to claim 1, wherein the grooves are provided by patterning the upper base material.

4. The foldable display device according to claim 1, further comprising:
   an upper buffer layer between the upper base material and the touch electrode array, wherein the touch electrode array includes a plurality of touch electrodes on the upper buffer layer, and at least one interlayer insulating film on the touch electrodes.

5. The foldable display device according to claim 4, wherein the grooves are provided by patterning at least one of the upper base material and the upper buffer layer.

6. The foldable display device according to claim 1, wherein a major axis of each of the grooves is in a horizontal direction.

7. The foldable display device according to claim 6, wherein the grooves are extended from one side edge of the at least one the folding part to another side edge of the at least one folding part across the display area.

8. The foldable display device according to claim 7, wherein the touch electrode array includes a plurality of touch electrodes in the display area which include second irregular parts located in regions overlapping the grooves.

9. A foldable display device comprising:
   a lower base material and an upper base material, each base material including at least one folding part and non-folding parts;
   a thin film transistor array located on the lower base material;
   an organic light emitting array located on the thin film transistor array; and
   a touch electrode array located on one surface of the upper base material, oppositely bonded to the organic light emitting array by an adhesive layer,
   wherein the touch electrode array is provided with a plurality of wirings having a zigzag shape and uneven depth level in at least the folding part,
   wherein the touch electrode array includes a plurality of grooves overlapping the plurality of wirings in at least the folding part,
   wherein each of the grooves overlaps at least a part of only one wiring along a width direction of the wiring, and
   wherein the wirings include uneven parts being uneven which overlap the grooves.

10. The foldable display device according to claim 9, wherein each groove overlaps at least a part of only one wiring at a bending region of the wiring.

11. The foldable display device according to claim 9, wherein:
   a width of each groove is greater than a width of the wiring which the groove overlaps, and
   the overlapped part of the wiring is located at a bottom of the groove.

12. The foldable display device according to claim 9, wherein a width of each groove is smaller than a width of the wiring which the groove overlaps.

* * * * *